United States Patent [19]

Rocheleau et al.

[11] 4,396,640
[45] Aug. 2, 1983

[54] APPARATUS AND METHOD FOR SUBSTRATE TEMPERATURE CONTROL

[75] Inventors: Richard E. Rocheleau, Wilmington; Dennis F. Brestovansky, Newark; Peter J. Lutz, Wilmington, all of Del.

[73] Assignee: Chevron Research Company, San Francisco, Calif.

[21] Appl. No.: 333,550

[22] Filed: Dec. 22, 1981

[51] Int. Cl.³ .................... B05D 3/06; B05D 3/14; B05D 5/12
[52] U.S. Cl. .................... 427/8; 118/666; 118/725; 427/50; 427/51; 427/55; 427/74
[58] Field of Search .................... 118/666, 725; 427/8, 427/74, 86, 55, 248.1, 255.5, 318, 50, 51

[56] References Cited

U.S. PATENT DOCUMENTS 4,104,420 8/1978 Jordan et al. .................... 427/74
4,224,355 9/1980 Lampkin et al. .................... 118/666 X

FOREIGN PATENT DOCUMENTS 60627 9/1982 European Pat. Off.
54-147177 11/1979 Japan .................... 118/666

Primary Examiner—Michael R. Lusignan
Attorney, Agent, or Firm—D. A. Newell; E. J. Keeling; A. Stephen Zavell

[57] ABSTRACT

An apparatus and a method for controlling the temperature of a substrate onto which thin films of semiconductor materials are vapor deposited. The apparatus contains a platen contacting a surface of said substrate over the entire length of the deposition zone; said platen having at least one cavity therein and a rounded edge where said substrate first contacts said platen of the beginning of said deposition zone.

18 Claims, 4 Drawing Figures

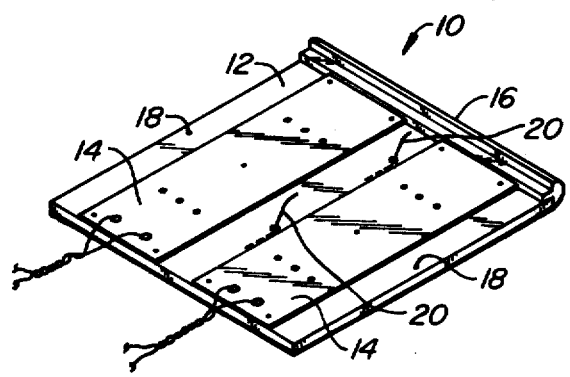
FIG._1.
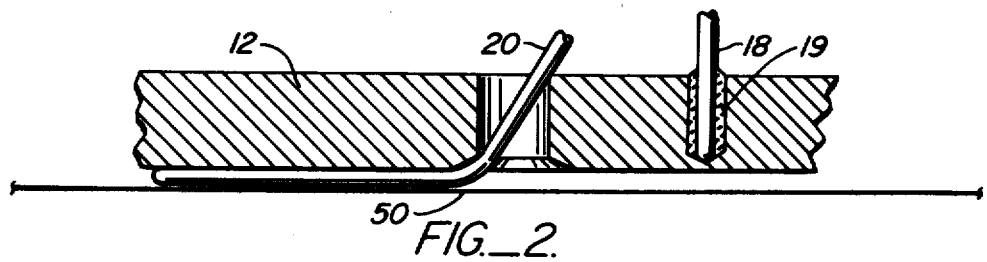
FIG._2.
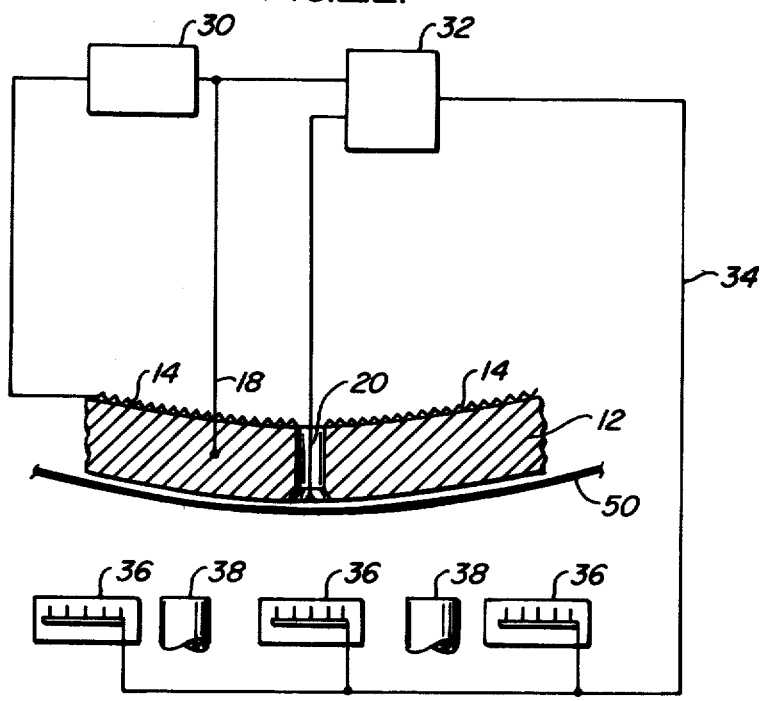
FIG._3.

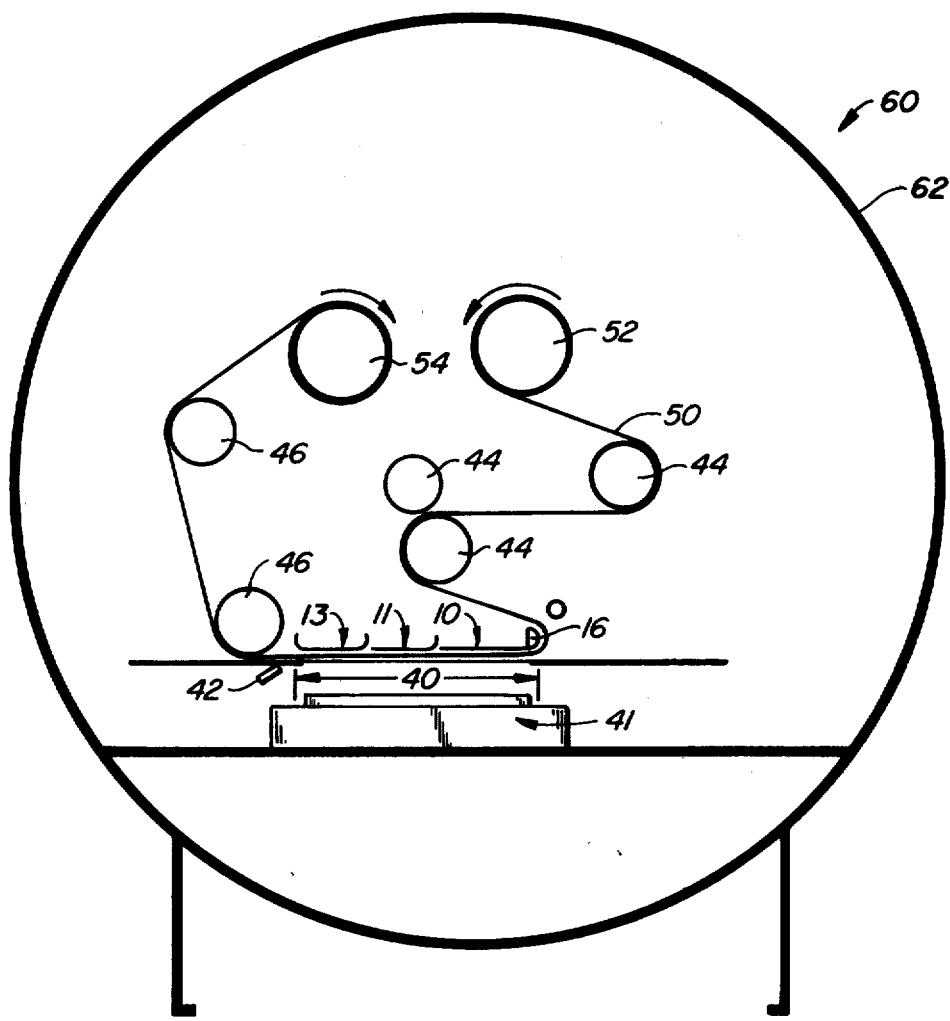
FIG._4.

4,396,640

APPARATUS AND METHOD FOR SUBSTRATE TEMPERATURE CONTROL

BACKGROUND OF THE INVENTION

This invention relates to an apparatus and a method for controlling the temperature of a substrate onto which a material is to be deposited. More specifically, the invention relates to a differential temperature control method and an apparatus for maintaining a specified temperature profile of a substrate during the formation of thin film semiconductor materials by processes which are carried out at low pressures or in vacuum. These processes are generally known in the semiconductor art and include, for example, vacuum evaporation as described in U.S. Pat. No. 3,531,335, plasma deposition as described in U.S. Pat. No. 4,064,521 or chemical vapor deposition as described in U.S. Pat. No. 2,671,739.

The properties of semiconductor materials deposited upon a substrate vary widely depending upon such factors as deposition temperature of the semiconductor material, temperature of the substrate, the rate of deposition and the like. Highly uniform semiconductor layers are required in the fabrication of photovoltaic cells which exhibit minimal batch-to-batch variations. If photovoltaic cells are to play an important role in meeting future energy needs, then large area quantities of photovoltaic devices will be needed which can be fabricated cheaply and effectively in a continuous process. The ability to uniformly control the substrate temperature and thus control a parameter which effects the final device characteristics is necessary if photovoltaic cells are to meet projected cost and efficiency goals in order to play a role in electrical power generation in the coming years.

To reduce the cost of photovoltaic cells and increase their distribution and use, researchers and manufacturers are investigating the fabrication of thin film semiconductor solar cells, such as amorphous silicon, CuInSe$_2$/CdS, Cu$_x$S/CdS photovoltaic cells and the like on thin flexible substrates. The thin flexible substrates can, for example, be copper foil or high-temperature polymeric materials which have an electrically conductive metallized surface. The flexible substrates are on the order of about 25 micrometers in thickness. The thinness of the substrate presents problems in maintaining a desired temperature profile or a uniform temperature of the substrate. In addition, thin film metallic substrates such as copper, are very reflective, i.e. having low emissivity, which makes accurate determination of the substrate temperature difficult. A continuously moving substrate in an automated continuous process complicates the measurement of the actual substrate temperature; therefore, temperature control is made difficult.

The closest art of which we are aware that relates to the deposition of uniform semiconductor layers having the desired properties for photovoltaic devices is concerned with batch-type operations in which small areas or multiple small area pieces are prepared. For example, in U.S. Pat. No. 3,531,335 the temperature of a small area substrate can be controlled by affixing a thermocouple to the substrate and using the thermocouple in conjunction with a proportional temperature controller which drives heaters that provide radiant heat to the substrate. This method, and related methods which are generally used in batch or laboratory scale processes are not readily applicable to moving substrate. Furthermore, these methods do not provide the necessary spatial temperature control required for the low cost manufacture of large area, semiconductor devices such as solar cells.

Methods and apparatus for the continuous coating of metals and semiconductors on moving substrates such as metal foils and polymer films are known. However, the art known to us teaches means for merely avoiding overheating of the substrate. Thus, for example, in U.S. Pat. No. 4,026,787, a polymer film substrate is drawn over a steel drum through which coolant is circulated during deposition of a cadmium sulfide semiconductor. The apparatus and method of U.S. Pat. No. 4,026,787 does not, however, provide control of substrate temperature sufficient to produce semiconductor layers having spatially uniform desired properties for photovoltaic devices. In particular, the aforementioned method and apparatus cannot maintain a uniform substrate temperature or desired temperature profile when the emissive properties of the substrate change, said change being inevitable as the semiconductor layer being deposited grows in thickness.

Thus, it would be highly desirable to have an apparatus which can heat and maintain the temperature of a stationary or continuously moving substrate at a constant temperature or with a desired temperature profile during the deposition of a thin film semiconductor material. It is also essential to have a method of determining the temperature of the substrate in order to control the properties of the deposited semiconductor film.

SUMMARY OF THE INVENTION

We have invented an apparatus for heating a thin film substrate onto which a semiconductor material is deposited and a method for controlling the temperature of a stationary or a moving substrate onto which said semiconductor film is deposited thereon. The apparatus is a novel platen which incorporates internal differential temperature control sensors to precisely determine the temperature of the substrate and drive radiative heaters facing the surface of the substrate onto which the semiconductor material is deposited to measure and control the temperature of the substrate.

BRIEF DESCRIPTION OF THE DRAWINGS

FIG. 1 illustrates a platen in accordance with our invention.

FIG. 2 illustrates a cross-sectional view of the platen of FIG. 1.

FIG. 3 illustrates a magnified view of the platen incorporating the embodiments for differential temperature control and additional heaters to measure and control the temperature of the substrate.

FIG. 4 illustrates a plurality of platens incorporated in an apparatus for continuous deposition of a thin film semiconductor material on a continuously moving substrate.

DETAILED DESCRIPTION OF THE INVENTION

The apparatus and method of our invention will be more clearly illustrated by referring to the Figures. FIG. 1 illustrates an apparatus for carrying out the method of our invention. The Figure illustrates a platen 10. The platen 10 incorporates a plate 12 fabricated from a rectangular piece of metal. The plate 12 can be fabricated of any material such as steel, copper, aluminum, iron, and the like which is stable at the deposition temperature, easy to shape and does not adversely react. In a particularly preferred embodiment, the plate 12 is fabricated from copper and coated with a material, known as hard chrome, to prevent scratching of a continuously moving copper or zinc-coated copper thin foil substrate.

The plate 12 has strip heaters 14 attached to the side of the plate opposite to the side which contacts the substrate. An example of a suitable heater is an Acra Electric model #TEEM 3" by 13" 500 watts 42 VAC with Stainless Steel sheathed. The heaters 14 heat the plate 12. The platen 10 further incorporates a bar 16 connected to the plate 12. The bar 16 initiates contact with the substrate and permits the substrate to bend around same and contact the heated plate 12. The bar 16 can be fabricated from the same materials as the plate 12. In a preferred embodiment, the platen and bar are fabricated to be sufficiently convex on the side contacting said substrate to prevent kinking of a substrate coated with the semiconductor material. A second bar, not illustrated, can be attached to the opposite end of the plate 12 to help the transition of the substrate out of a semiconductor deposition zone.

The plate 12 incorporates temperature sensors 18, such as thermocouples, to monitor the temperature of the platen 10. An example of a suitable thermocouple is a 20 or a 24 gauge chromel-alumel thermocouple, a product of Omega Engineering, Inc. Holes are provided in the plate 12 for the temperature sensors 20 which monitor the temperature of the substrate.

The installation of temperature sensors 18 and 20 is more clearly illustrated in FIG. 2. The plate temperature sensor is fixed in the plate 12 with a ceramic cement 19 or other suitable material. The substrate temperature sensor 20 is inserted through the hole in plate 12 to be in thermal communication with the substrate 50. The temperature sensor 20 is a shielded thermocouple which is extremely thin on the order of about 0.025 cm, so as to minimize deformation of the substrate 50. As illustrated in FIG. 2, sensor 20 is in physical contact with plate 12 and substrate 50. This configuration is satisfactory. However, it is preferred to have a portion of plate 12 hollowed out, or to otherwise dispose sensor 20, such that sensor 20 is not in physical contact with substrate 50, but is in thermal communication with substrate 50.

The operation of temperature control is more clearly illustrated by referring to FIG. 3. FIG. 3 illustrates a section of the platen and a method of controlling the temperature of the continuously moving substrate. The substrate 50 contacts the plate 12. The temperature of the plate 12 is controlled by a controller 30 connected to the strip heaters 14. An example of a suitable controller is a model 919/PAP/K/0°-999° C./P10/DVT/115 VAX, a product of the Eurotherm International Co. The temperature sensor 18 is connected to an input of a differential temperature controller 32. An example of a suitable differential temperature controller is a model 919/PAP/N/0±1.99 mV/P10/DVT/115 VAX controller, a product of Eurotherm International Co. The other input is connected to temperature sensor 20. The controller heats the platen to a temperature $T_1$ which is measured by temperature sensor 18. The substrate 50 will be at some lower temperature $T_2$. The magnitude of $T_1-T_2$ depends upon the resistance to heat transfer at the substrate-platen interface, and source temperature, and radiative loss from the surface of the substrate upon which the thin film semiconductor is deposited. Temperature sensor 20 situated in the cavity in the plate will come to a steady state temperature $T_3$ intermediate between $T_1$ and $T_2$. The differential controller 32 compares the temperature of sensors 20 and 18 and drives facia heaters 36 such that the difference between sensors 18 and 20 is substantially zero. A suitable example of facia heaters are radiative heaters model RTU-2063AX35, 120 V 400 watts heaters, products of Chromalox Sales Co.

With differential temperature control, if temperature of plate 12 is at temperature $T_1$ and the temperature in the cavity $T_3$ is equal to $T_1$, then $T_2$ must equal $T_1$. The differential temperature controller 32 senses $T_1-T_3$ and this difference signal 34 is used to drive the facia heaters 36. If temperature profiling through the deposition zone is desired where emissive properties vary with film thickness, the platen and the facia heaters can be divided into separately controlled zones to provide temperature profiling of the substrate as it moves over the deposition zone. Alternatively, a plurality of platens can be employed to provide temperature profiling of the substrate. In addition to the heaters 36, the source nozzles 38, for the deposition of the semiconductor film, can be configured so as to provide a calculated amount of radiative heating of the substrate.

The differential temperature control provides means for temperature measurement of highly reflective substrates and is more accurate than pyrometric sensing means for measuring the temperature. Fabricating the plate 12 from a material having a high thermal conductivity, such as copper, provides improved spatial uniformity of the substrate temperature and the differential temperature control provides substantially more accurate temperature control regardless the variations in the property of the substrate, such as surface roughness, emissivity, and reflectivity. The utility and novelty of the invention will be better appreciated by recognizing that there is a tendency for the temperature of the surface of certain areas of a moving substrate to deviate from the desired value. These deviations are due, for example, to localized variations in the properties of the substrate which affect the rate heat transfer, such as emissivity. Deviations are also likely from local variations in heat input to the substrate such as inhomogeneous or fluctuating radiation from the heaters 36. This problem is especially accute with substrates which are thin or have low thermal conductivity. Since said areas are likely to be located away from the temperature sensor 20, the deviation could otherwise go uncorrected. It would be impractical to dispose such a plurality of sensors to overcome this problem. Thus, a particular advantage of this invention is thermal communication between the substrate 50 and the plate 12 which automatically corrects localized deviations in the temperature of the substrate. Thermal communication between the substrate 50 and the plate 12 may be by radiation, by convection, or preferably, by conduction. It is therefore desirable to have the substrate 50 in intimate contact with the plate 12 of the platen 10.

The platen and method of temperature control permits the uniform maintenance or temperature profiling of the substrate to within plus or minus 5° at operating temperatures on the order of 180° to 300° C. and preferably within the range of 210° to 250° C. for the deposition of cadmium-rich cadmium sulfide films in the fabrication of cadmium sulfide/copper sulfide solar cells.

The placement of the platen in the fabrication of semiconductor films is more clearly illustrated by referring to FIG. 4. FIG. 4 is a simplified illustration of a deposition apparatus 60, such as a High Vacuum Roll Coater A500 BI/5, a product of Leybold-Heraeus Vacuum System Inc., modified to contain our invention. The vacuum chamber 62 contains the apparatus for depositing the semiconductor films on a substrate which incorporates a plurality of platens 10, 11, and 13, for the temperature profiling of the substrate. However, a more simple embodiment of the invention in the vacuum chamber 62 would contain only one platen the size of platens 10, 11, and 13. A substrate source 52 feeds the substrate 50 over rollers 44 to contact the platens over a deposition zone illustrated as line 40. The substrate 50 can be a continuous thin film such as a copper foil or a continuous support which contains discrete pieces thereon of a suitable substrate material for solar cells. The deposition zone 40 is between the substrate 50 and a deposition source 41 which incorporates radiative heaters 36, not illustrated, between and among semiconductor source nozzles 38, also not illustrated. The substrate 50 bends around bar 16 on the platen 10 and contacts the platens. The platen 13 contains a bar at the opposite end of the platen to facilitate the exiting of the substrate from the deposition zone. Precise temperature control is maintained in accordance with the differential temperature control operating procedure outlined with respect to the discussion of FIG. 3. The additional platens 11 and 13 enable the temperature of the substrate to be temperature profiled, if desired, during the deposition of the semiconductor film. A rate monitor 42 monitors the rate of evaporation. An example of a suitable source for a semiconductor material such as CdS is the sparger system disclosed in British Patent Application No. 8,030,657 filed Sept. 23, 1980, said application incorporated herein by reference. However, any deposition source known in the art, such as a plurality of heated crucibles, is suitable. Thereafter, take-up reels 46 transfer the substrate 50 to a take-up spool 54.

For example, the apparatus can be used to deposit cadmium sulfide film on a zinc plated copper substrate by evacuating chamber 60 to about $10^{-5}$ torr and heating semiconductor source 41 to a sufficient temperature to vapor deposit cadmium sulfide on the substrate 50. The substrate 50 is heated to a preferred temperature on the order of about 210° to 250° C. while the substrate moves across the deposition zone at a rate of from about 0.3 to about 12 cm per minute, preferably 0.6 to 6 cm per minute. The length of time in the deposition zone, as well as the rate of evaporation from the source, determines the thickness of the film.

It should be understood that the invention is not meant to be limited solely to the details described herein. The invention is useful for any process involving the formation of semiconductor, insulator or conductor layers in large areas on a substrate, including substrates which are essentially rigid such as, for examples, glass or ceramic. Modifications which should be obvious to one of ordinary skill in the vacuum coating art, are contemplated to be within the scope of the invention.

What is claimed is:

1. A method of heating and controlling the temperature of a substrate in a vacuum deposition chamber in the manufacture of thin films of semiconductor material, said method comprising:

contacting a side of said substrate to a platen over the entire length of a deposition zone, said platen having means for transferring heat with said substrate;
   heating said platen to a temperature;
   measuring the temperature of said platen;
   maintaining the temperature in a cavity in said platen equal to the temperature of said platen so as to control the temperature of said substrate.

2. The method according to claim 1 wherein the temperature in the cavity is adjusted to equal the temperature of the platen by radiative heating the surface of said substrate opposite to the surface contacting said platen.

3. The method according to claim 2 wherein said measuring of the temperature is provided by a temperature sensor in said cavity, wherein said sensor is a thermocouple.

4. The method according to claim 3 wherein the thermocouple is in thermal communication with said substrate.

5. The method according to claim 1 wherein the surface of said platen contacting said substrate is sufficiently convex on the side contacting said substrate to prevent kinking of said substrate.

6. The method according to claim 5 wherein the surface of said platen contacting said substrate is coated with material to reduce the scratching of said substrate.

7. The method according to claim 6 wherein said platen is coated with hard chrome.

8. The method according to claim 7 wherein said substrate is copper foil.

9. The method according to claim 8 wherein the temperature of said substrate is adjusted such that a nonstoichiometric, cadmium-rich film of cadmium sulfide is deposited on said substrate.

10. The method according to claim 1, 2, 4, 5, 7 or 8 wherein the substrate is moving.

11. An apparatus for heating a substrate in a deposition chamber comprising:

a platen contacting a surface of said substrate over the entire length of a deposition zone, said platen having at least one cavity therein and a rounded edge where said substrate first contacts said platen at the beginning of said deposition zone;
   means for heating said platen;
   means for sensing the temperature of said platen;
   means for sensing the temperature of said substrate within said cavity;
   means for maintaining the temperature within said cavity equal to the temperature of said platen; and
   means for contacting said substrate to said platen.

12. The apparatus according to claim 11 wherein the surface of said platen contacting said substrate is sufficiently convex on the side contacting said substrate to prevent kinking of said substrate.

13. The apparatus according to claim 12 wherein said means for sensing the temperature of said platen is a thermocouple in said platen and said means for sensing the temperature of said substrate is a thermocouple in said cavity, said heating means is at least one strip heater on the side of said platen opposite to the side of said platen in contact with said substrate, said thermocouple in said platen adjusts the temperature of said platen by controlling said strip heater(s).

14. The apparatus according to claim 13 further incorporating at least one radiative heater facing the side of said substrate opposite to the side contacting said platen, said radiative heater is controlled to adjust the substrate temperature through a differential temperature controller, said differential temperature controller is connected to said thermocouple in said platen and said thermocouple in said cavity.

15. The apparatus according to claim 14 wherein the temperature of said substrate is adjusted by the differential temperature controller adjusting the heat input to said substrate from said radiative heater.

16. The apparatus according to claim 15 wherein a plurality of radiative heaters are connected to said differential temperature controller.

17. The apparatus according to claim 16 wherein said apparatus incorporates a plurality of platens and differential temperature controllers.

18. The apparatus according to claim 17 wherein the temperature of said substrate is profiled over the deposition zone by adjusting the heating of the radiative heaters and the temperatures of the plurality of platens.

* * * * *